United States Patent [19]
Matsuoka

[11] Patent Number: 5,194,350
[45] Date of Patent: Mar. 16, 1993

[54] METHOD AND APPARATUS FOR CREATION OF RESIST PATTERNS BY CHEMICAL DEVELOPMENT

[75] Inventor: Yasuo Matsuoka, Kawasaki, Japan

[73] Assignee: Kabushiki Kaisha Toshiba, Kawasaki, Japan

[21] Appl. No.: 617,797

[22] Filed: Nov. 26, 1990

Related U.S. Application Data

[62] Division of Ser. No. 400,713, Aug. 30, 1989, Pat. No. 4,982,215.

[30] Foreign Application Priority Data

Aug. 31, 1988 [JP] Japan .................................. 63-217607

[51] Int. Cl.⁵ .......................... G03C 5/00; G03F 7/30
[52] U.S. Cl. ...................................... 430/30; 430/325
[58] Field of Search ................ 430/30, 279, 325, 330, 430/331

[56] References Cited

U.S. PATENT DOCUMENTS 4,755,442 7/1988 Hasebe et al. .......................... 430/30

Primary Examiner—Marion E. McCamish
Assistant Examiner—Kathleen Duda
Attorney, Agent, or Firm—Foley & Lardner

[57] ABSTRACT

Creation of a resist pattern through chemical development of a resist layer which has been subjected to a patternmaking process such as selective exposure to electromagnetic rays or drawing with an electron beam. A workpiece, having the resist layer formed on an electroconductive surface of a substrate, is dipped in a bath of developing liquid at a first temperature. During the progress of the development the magnitude of an electric current flowing between the conductive surface of the workpiece and an electrode also immersed in the bath is constantly monitored in order to determine a moment at which the withdrawal of the developing liquid from the vessel is to be commenced. Upon commencement of the liquid withdrawal from the vessel, an additional amount of developing liquid is charged into the vessel at a second temperature lower than the first temperature. The progress of development during the liquid withdrawal is thus retarded in order to assure a sufficient length of time for the recovery of the used liquid for recirculation.

5 Claims, 3 Drawing Sheets

METHOD AND APPARATUS FOR CREATION OF RESIST PATTERNS BY CHEMICAL DEVELOPMENT

This application is a division of application Ser. No. 07/400,713, filed Aug. 30, 1989, now U.S. Pat. No. 4,982,215.

BACKGROUND OF THE INVENTION

This invention relates to the art of developing resist patterns through removal of parts of a resist layer on an electroconductive surface with use of a developing liquid. More specifically, the invention deals with a method of, and an apparatus for, automatically precisely developing resist patterns on substrates such as bodies of vitreous material with an electroconductive layer thereon.

The lithographic process has been widely practiced for the fabrication of photomasks and conductive patterns on semiconductor wafers. The process is such that a resist coating on a desired substrate is first subjected to a patternmaking process such as selective exposure to electromagnetic rays such as ultraviolet rays, or drawing with a beam of particles such as electrons. Then the resist coating is developed into a desired pattern with use of a chemical developing liquid. The development of the resist coating is possible by either dipping, spraying, or paddling.

Japanese Unexamined Patent Publication No. 62-117324 proposes a developing apparatus based on the dip method. This prior art apparatus comprises an open-top developing vessel, which may be either fixed or movable, to be filled with a developing liquid. The developing vessel has disposed therein a fixed or movable table on which is to be placed a workpiece having a resist coating that has undergone the process of exposure or drawing. Dipped in the developing liquid within the vessel, the resist coating can be automatically developed into a desired pattern with high precision.

One of the features of the prior art apparatus is the provisions for recirculating and reconditioning the used developing liquid. As each workpiece is processed with a fresh developing liquid, the production of defects in the developed resist patterns is reduced to a minimum.

However, the above cited prior art apparatus has proved to have a serious drawback. The drawback may arise in the event of a change in the conditions of the preceding process of exposure or drawing, in the temperature or kind of the developing liquid in use, or in the physical conditions of the resist coatings. In such event the length of time needed for developing each workpiece may become shorter than that for the recovery of the used developing liquid from within the vessel. Then the prior art apparatus becomes totally incapable of use. The following is a more detailed discussion of how this inconvenience takes place.

In the production of photomasks, as heretofore practiced in the art, the resist is coated on an electroconductive layer, such as chromium, that has been preformed on a substrate of vitreous material. With this workpiece dipped in a bath of developing liquid, a voltage is impressed between the electroconductive layer and an electrode also immersed in the bath. The current flowing as a result of the voltage application varies in magnitude with the progress of the etching of the resist coating (see FIG. 5). The current magnitude first decreases with the progress of development, then starts increasing as the electroconductive layer becomes partly exposed, and then again decreases after reaching a peak value.

A main developing operation continues a time tm until the current magnitude reaches the peak value. Then the workpiece is subjected to additional development for a time equal to 20 percent of the main developing time tm. With the resist pattern developed in this manner, the opening in the pattern that is designed to be 2.00 micrometers in width will have an actual width of 2.03 micrometers or so.

If the main developing time tm is 288 seconds, the additional developing time is approximately 58 seconds (288×0.2). The prior art apparatus takes approximately 30 seconds for recovering 95 percent of the developing liquid that has been used for processing each workpiece. Being laid horizontally and covered with the remaining liquid, the workpiece is still undergoing the process of development during this 30-second recovery time. Consequently, the additional developing time must actually be 28 seconds (58−30).

Let it be supposed that the main developing time tm is cut down to, say, 134 seconds, due for example to a higher degree of exposure to which the resist coating has been subjected, or to some other change in the processing conditions or in the physical conditions of the resist coating itself. Then the additional developing time is also reduced to 27 seconds (134×0.2), which is shorter than the recovery time. Since development continues during the recovery time as aforesaid, the precise creation of resist patterns becomes impossible. For example, the resist pattern opening that is designed to be 2.00 micrometers in width may actually become as wide as 2.10 micrometers.

Therefore, conventionally, the recovery time has had to be cut short for the creation of resist patterns with a desired degree of precision. A substantial proportion of the used developing liquid has been drained and wasted.

SUMMARY OF THE INVENTION

The present invention provides a simple and readily practicable solution to the problem of how to develop resist patterns with high precision regardless of the length of developing time required for each particular workpiece and without sacrificing the percentage of recovery of the used developing liquid for reuse.

Briefly summarized in one aspect thereof, the invention provides a method of creating a resist pattern by chemically developing a resist layer which has been subjected to a patternmaking operation such as selective exposure or drawing. A workpiece, having a resist layer formed on an electroconductive surface of a substrate, is dipped in a bath of developing liquid having a first predetermined temperature. During the progress of development the magnitude of an electric current flowing between the electroconductive surface of the workpiece and an electrode also immersed in the bath is constantly monitored in order to determine the moment for the commencement of the withdrawal of the developing liquid from the vessel. Then, upon commencement of liquid withdrawal, an additional amount of developing liquid is introduced into the developing liquid at a second predetermined temperature which is lower than the first predetermined temperature.

The introduction of the additional amount of developing liquid at a reduced temperature serves the purpose of retarding the progress of development during withdrawal of the used liquid from the developing vessel. A sufficient length of time can therefore be gained for the complete recovery of the used main developing liquid, no matter how short the main developing time may be. Moreover, since the additional developing time can be made longer than the recovery time of the liquid used for the main developing operation, the resist patterns can be finished to a desired degree of dimensional precision through control of the additional developing time.

Another aspect of the invention concerns an apparatus for use in carrying the above summarized method into practice. Briefly, the apparatus comprises developing vessel means for providing a bath of developing liquid in which a workpiece is to be dipped for development; means for providing a recirculation path for the withdrawal of the used developing liquid from the developing vessel means and for the resupply of the used developing liquid into the developing vessel means; heater means on the recirculation path for heating the developing liquid to a first predetermined temperature preparatory to supply into the developing vessel means; and supply means for supplying the developing liquid into the developing vessel means at a second predetermined temperature which is lower than the first predetermined temperature.

Preferably, the supply means comprises means for providing a branch path branching off from the recirculation path, and cooler means on the branch path for cooling part of the recovered developing liquid to the second predetermined temperature preparatory to introduction into the developing vessel means.

It will therefore be understood that the required additional amount of developing liquid at the reduced temperature is obtained by cooling part of the liquid that has been recovered from the developing vessel. The complete apparatus is well calculated to fully automate the production of high-precision resist patterns.

The above and other features and advantages of this invention and the manner of realizing them will become more apparent, and the invention itself will best be understood, from a study of the following description and appended claims, with reference had to the attached drawings.

DETAILED DESCRIPTION OF THE INVENTION

Figure 1:
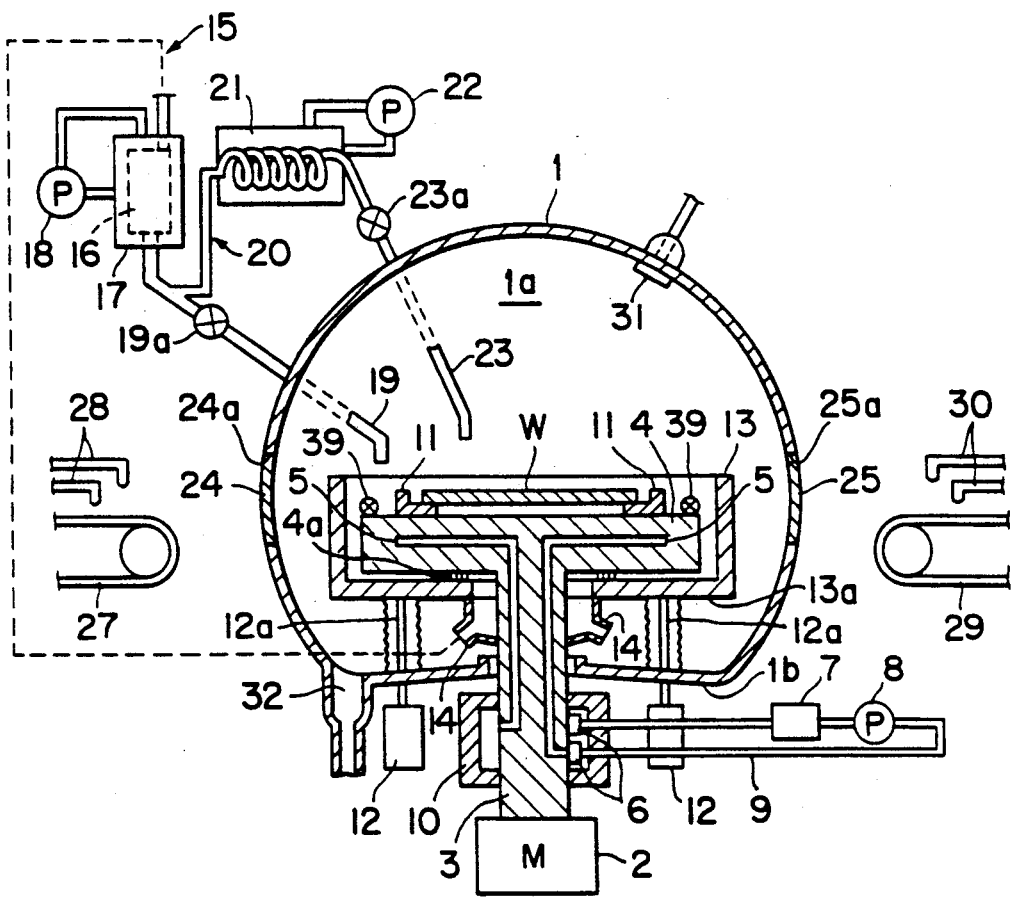
FIG. 1 is a diagrammatic vertical section through the developing apparatus constructed in accordance with the invention.
Figure 2:
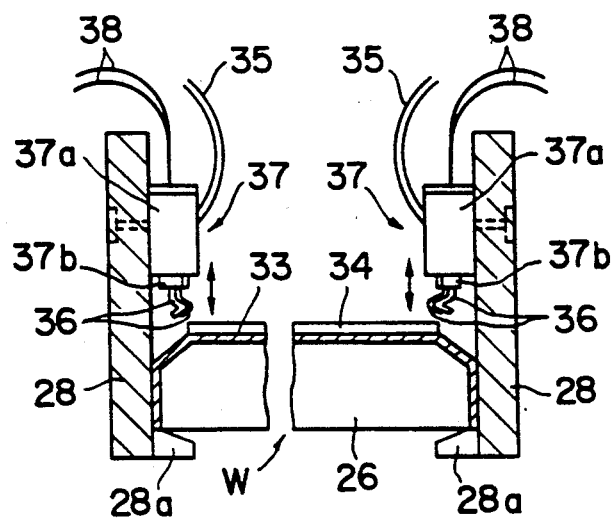
FIG. 2 is an enlarged vertical section, partly in elevation and partly broken away for illustrative convenience, showing a pair of loading arms carrying a workpiece in the apparatus of FIG. 1.

The invention will now be described in terms of a preferred form of apparatus for automatically creating resist patterns by developing resist coatings on substrates. With reference to FIG. 1 the exemplified developing apparatus has an enclosure 1 fluid-tightly defining a developing chamber 1a in which resist patterns are to be developed. The enclosure 1 can be fabricated from a plastic such as Teflon (trademark). Disposed under the enclosure 1 is a motor drive unit 2 coupled to an upstanding drive spindle 3. This drive spindle rotatably extends through the bottom 1b of the enclosure 1 and has a rotary table 4 formed in one piece on its top end. Thus the rotary table 4 revolves about a vertical axis with respect to the enclosure 1. The rotary table 4 has a workpiece rest 11 formed thereon for supporting a workpiece W to be processed. FIG. 2 shows the workpiece W as being comprised of a resist coating 34 preformed on an electroconductive layer 33 such as a thin film of chromium on a substrate 26 of vitreous material.

FIG. 1 also reveals a passageway 5 of water at normal temperature extending through the spindle 3 and rotary table 4. The water passageway 5 is open at a lower end portion of the spindle 3, exposed under the enclosure 1, for communication with a recirculation conduit 9 via joints 6. The recirculation conduit 9 is provided with an electronically controlled constant temperature vessel 7 and a pump 8. A fixed coupling 10 of tubular shape slidably but watertightly encircles the spindle 3 for the establishment of communication between the passageway 5 and the recirculation conduit 9. Thus the water at constant temperature recirculates through the spindle 3 and the rotary table 4 in order to maintain the latter at as constant a temperature as practical.

Mounted upstandingly under the enclosure 1 are a plurality of fluid-actuated cylinders 12, two shown, having piston rods 12a slidably extending through the bottom 1b of the enclosure. Within the enclosure 1 the piston rods 12a are coupled to the bottom 13a of an open-top developing vessel 13 in which is disposed the rotary table 4.

Therefore, upon extension of the cylinders 12, the bottom 13a of the developing vessel 13 becomes watertightly held against the underside of the rotary table 4 via an annular seal 4a. A developing liquid may then be filled in the vessel 13 for the immersion of the workpiece W on the table 4. The contraction of the cylinders 12 causes the descent of the developing vessel 13 away from the table 4, with the consequent discharge of the developing liquid from within the developing vessel through discharge ports 14.

The discharged developing liquid is not wasted but recirculated back into the vessel 13. For such recirculation of the developing liquid, the discharge ports 14 communicate via a conduit system 15 with a supply reservoir 16. This reservoir is provided with a constant temperature heater 17 under electronic control, through which the recovered liquid is forced by a pump 18 in order to be reheated to a prescribed constant temperature. The reheated developing liquid is subsequently recharged into the developing vessel 13 via a first supply conduit 19 having a valve 19a and extending through the enclosure 1. Preferably, a filter may be provided somewhere on the recirculation path of the developing liquid for the removal of undesired solids.

The first supply conduit 19 also communicates with a conduit 20 branching off therefrom at a point upstream of the valve 19a. The branch conduit 20 leads to a cooler 21, complete with a pump 22, whereby the developing liquid is cooled to a constant temperature. The cooled developed liquid is also supplied into the developing vessel 13 via a second supply conduit 23 having a valve 23a.

Despite the showing of FIG. 1, it is not essential that the cooler 21 communicate with the supply reservoir 16 via the branch conduit 20. Instead, an independent recirculation path could be provided for the supply of the reduced temperature developing liquid into the developing vessel 13.

The enclosure 1 is provided with a workpiece entrance opening 24a and a workpiece exit opening 25a, which are closed by doors 24 and 25, respectively, at its opposite sides. Disposed outside the entrance opening 24a are an infeed conveyor 27 for transporting the successive workpieces W to be processed, and a pair of loading arms 28 for loading them on the rotary table 4 within the enclosure 1. Typically, each workpiece has a resist coating on a chromium covering on a vitreous substrate and has undergone the usual baking and electronic drawing processes. Disposed outside the exit opening 25a, on the other hand, are a delivery conveyor 29 for delivering the processed work to the next processing station, and a pair of unloading arms 30 for unloading the processed work from within the enclosure 1 for deposition on the delivery conveyor.

Seen at 31 in FIG. 1 is a spray nozzle mounted to the top of the enclosure 1 for spraying a suitable rinsing liquid. The sprayed rinsing liquid, as well as the unrecovered developing liquid, is to be discharged from within the enclosure 1 through a drain port 32 formed in its bottom 1b. This drain port can also be utilized for the withdrawal of a gas that has been filled in the developing chamber 1a.

FIG. 2 is an illustration of the workpiece W being held by and between the pair of loading arms 28. The workpiece W rests on a pair of hooks 28a formed one on each loading arm 28. The loading arms 28 are provided with contact means 37 for electrically contacting the conductive layer 33 of each workpiece W and hence for connecting the same in circuit with an electrode 39, FIG. 1, on the rotary table 4.

Per se conventional in the art, the contact means 37 include a fluid-actuated cylinder 37a of the single-acting, spring-return type mounted to each loading arm 28. The cylinder 37a has a piston rod 37b to be moved up and down as a fluid, typically gas, is forced into and withdrawn from the cylinder via a conduit 35. The piston rod 37b carries a pair of contact members 36, each in the form of a wire bent into the shape of a recumbent V, for engagement with the conductive layer 33 of the workpiece W being held by the pair of loading arms 28. The contact members 36 are electrically connected to lead conductors 38 and thence to the electrode 39 on the rotary table 4.

Operation

The following operational description of the developing apparatus is meant also to be explanatory of the method of this invention. The fluid-actuated cylinders 12 may first be extended to move the developing vessel 13 into fluid-tight engagement with the rotary table 4 via the seal 4a. Then a developing liquid may be charged into the developing vessel 13 by opening the valve 19a on the first supply conduit 19. It is understood that this developing liquid has been heated to a constant temperature of, for example, 25° C. by the constant temperature heater 17.

Then, with the entrance door 24 opened by any suitable means, the foremost workpiece W on the infeed conveyor 27 may be picked up by the pair of loading arms 28 and thereby carried into the developing chamber 1a. It is understood that the resist layer 34 of the workpiece W has been subjected to some such patternmaking procedure as selective exposure to electromagnetic rays or drawing with an electron beam.

Over the developing vessel 13, the loading arms may be lowered for loading the workpiece on the rest 11 on the rotary table 4 and hence for dipping the workpiece in the developing liquid within the vessel 13. Then the entrance door 24 may be closed. The loading arms 28 must be left inserted in the developing chamber 1a during the subsequent processing of the workpiece. It is therefore understood that the entrance door 24 is apertured to permit the loading arms 28 to extend therethrough with minimal clearances when the door is closed.

Preferably, during the progress of development, the temperature of the developing liquid within the vessel 13 should be constantly monitored by a temperature sensor, not shown, immersed therein. Whenever the temperature deviates from a preassigned range, the constant temperature heater 17 may be automatically controlled to return the temperature of the developing liquid to the preassigned range. The temperature of the developing liquid should be under as strict control as practical for the production of precise resist patterns.

Also, during development, the pair of fluid-actuated cylinders 37a of the contact means 37 on the loading arms 28 are held extended under spring pressure. The contact members 36 on the piston rods 37b of the cylinders 37a are therefore sprung into engagement with the conductive layer 33 of the workpiece W for connecting the same in circuit with the electrode 39 on the rotary table 4. The current flowing between the conductive layer 33 and the electrode 39 is constantly monitored for detecting a predefined magnitude at which the primary developing process is to be terminated.

Figure 3:
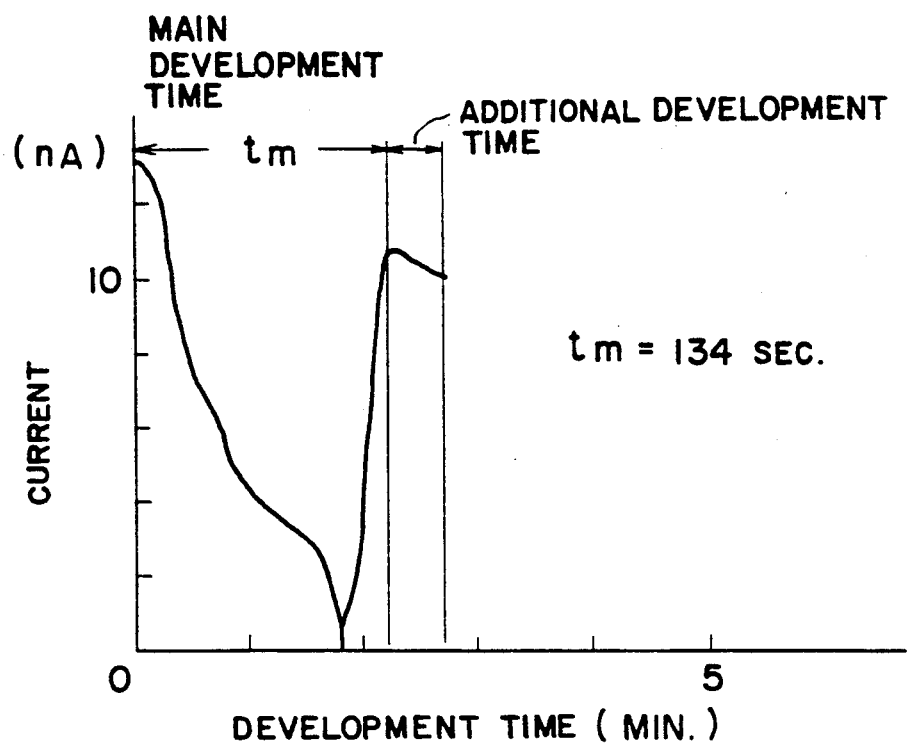
FIG. 3 is a graph plotting the curve of the magnitude of an electric current flowing between the conductive surface of the workpiece and an electrode within a developing vessel during development, against time, the graph being explanatory of the operation of the apparatus of FIG. 1.

FIG. 3 graphically represents the magnitude of the current flowing between the conductive layer 33 and the electrode 39 during development, against time. The graph is based on the data obtained when a commercially available electron-gun resist EBR-9 (trademark owned by Toyo Rayon K.K.) was developed with methylene isobutyl ketone by the apparatus of FIGS. 1 and 2. The main developing operation may be continued a time tm until the current magnitude reaches a peak value after momentarily dropping to zero.

Upon completion of the main developing operation, the loading arms 28 may be withdrawn from the developing chamber 1a, leaving the workpiece W on the rest 11 on the rotary table 4. Then the entrance opening 24a may be completely closed by the door 24. Then the cylinders 12 may be contracted to lower the developing vessel 13 out of fluid-tight contact with the rotary table 4. The developing liquid that has been filled in the vessel 13 will then be discharged through the discharge ports 14 for recovery into the supply reservoir 16.

Substantially concurrently with the withdrawal of the developing liquid from the vessel 13, the valve 23a on the second supply conduit 23 may be opened. Thereupon the developing liquid that has been cooled to a temperature lower than that of the primary developing liquid by the cooler 21 will be charged into the vessel 13. This developing liquid has the same composition as the primary developing liquid. In practice, approximately 200 cubic centimeters of the developing liquid that has been cooled to 10° C. or so may be dropped onto the surface of the primary developing liquid being withdrawn from the vessel 13.

As the developing liquid becomes cooler by the addition of the cooled developing liquid at the end of the main developing time tm, the progress of the additional development to which the workpiece W is subjected during the recovery of the developing liquid can be retarded. Consequently, the additional developing time may be set at, for example, 40%, instead of 20% as in the prior art, of the main developing time.

Figure 5:
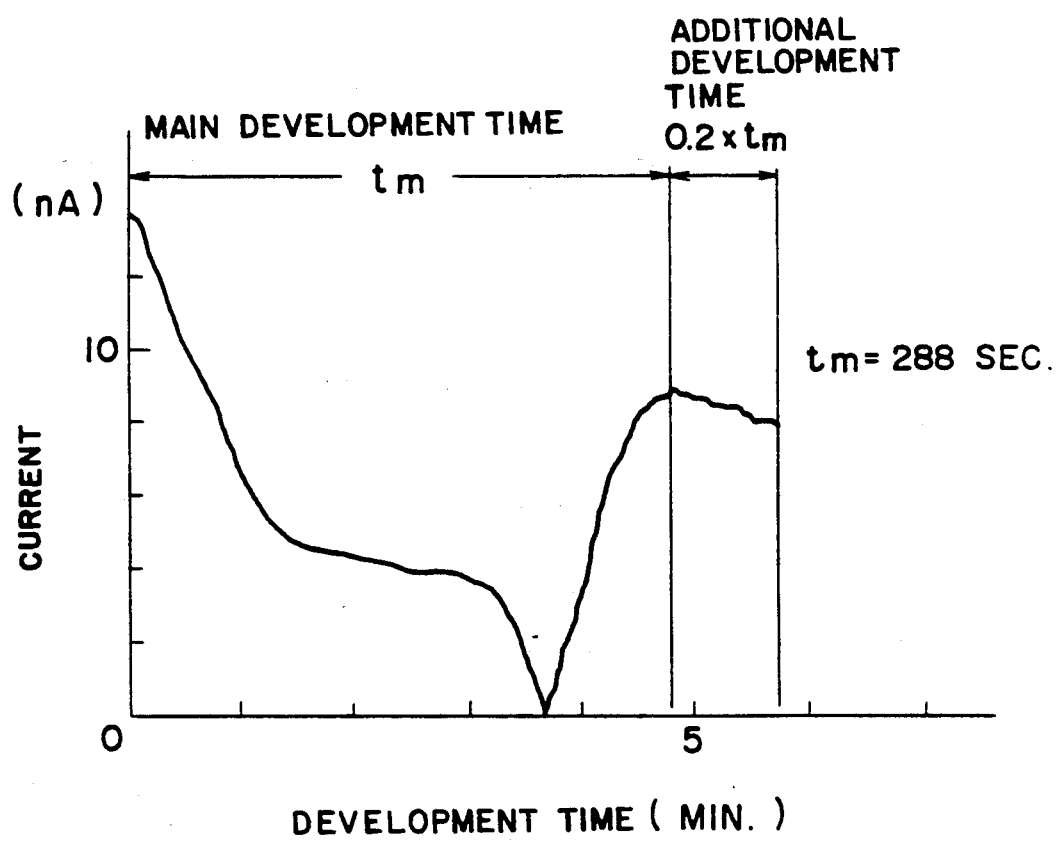
FIG. 5 is a graph similar to FIG. 3 but explanatory of the problem heretofore encountered in the art.

Let us suppose that the main developing time tm is as short as 134 seconds, compared with 288 seconds as in the prior art case of FIG. 5. The additional developing time can be set at 54 seconds (134×0.4) according to the invention. This additional developing time is much longer than the minimum required recovery time of approximately 30 seconds. Thus, according to the invention, a sufficient time can be set for the complete recovery of the used developing liquid without in any way adversely affecting the preciseness with which resist patterns are fabricated.

Figure 4:
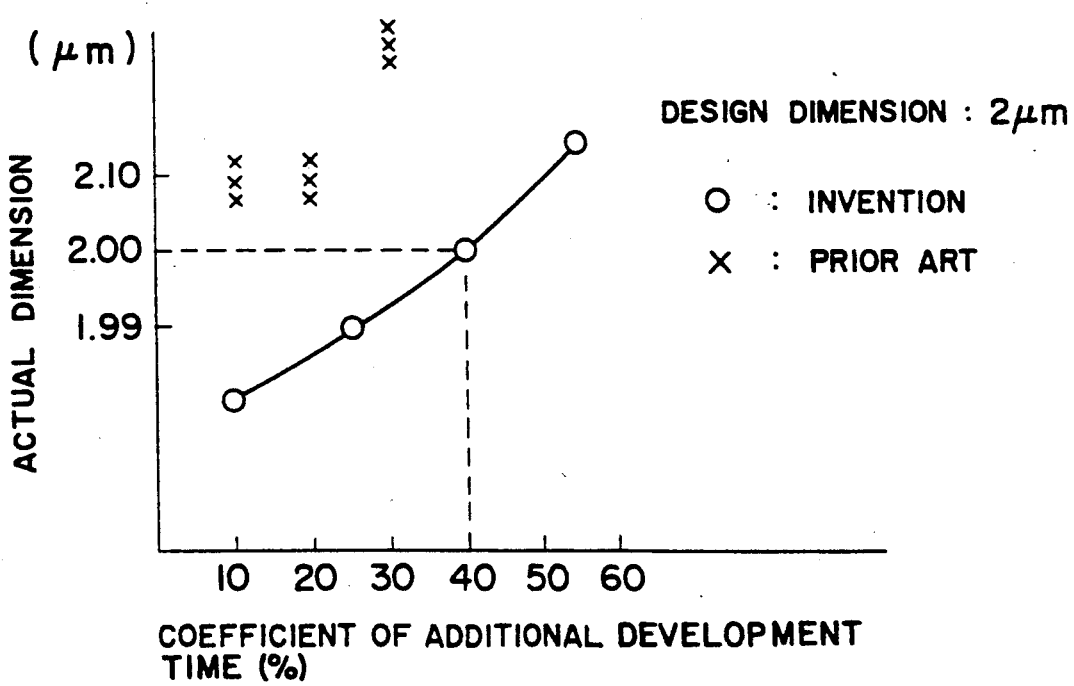
FIG. 4 is a graph explanatory of the dimensional accuracy of resist patterns fabricated in accordance with the invention, as compared with those fabricated according to the prior art.

FIG. 4 graphically demonstrates the advantage gained by the invention over the prior art in terms of the dimensional accuracy of the resist patterns obtained as a result of experiments. According to the prior art, in which the temperature of the developing liquid remains the same during both the main developing time and the additional developing time, no satisfactory dimensional control was possible when the additional developing time was set at 20% or less of the main developing time, because of limitations in recovery time. By contrast, according to the invention, in which the temperature of the developing liquid is reduced during the additional developing time, dimensional variations could be kept within plus or minus 0.03 micrometers when the additional developing time was set at, for example, 40% of the main developing time. The graph also indicates that invention permits dimensional control through appropriate determination of the additional developing time.

It is recommended that a table be prepared which lists the various percentages of the additional developing time with respect to the main developing time according to the various sets of known conditions of resist development.

The additional developing liquid may, or may not, be recovered. Being cooler than the main developing liquid, the additional developing liquid would make temperature control rather difficult if recovered and intermingled with the main developing liquid. However, if the difficulty of temperature control is somehow overcome, the additional developing liquid may also be recovered for greater economy.

Following the completion of development, the motor drive unit 2 may be energized to set the rotary table 4 into rotation together with the workpiece W thereon. Simultaneously, any suitable liquid may be sprayed on the workpiece W from the spray nozzle 31 for rinsing. Then, upon completion of the rinsing, the workpiece W may be dried by rotating the table 4 at a speed of, say, 2000 revolutions per minute. Then the workpiece W may be unloaded from within the enclosure 1 by the pair of unloading arms 30 and transported to the next processing station by the delivery conveyor 29.

It is, of course, understood that the invention is not to be limited by the exact details of the foregoing disclosure. For example, the main developing liquid may be charged into the developing vessel 13 after, instead of before, the workpiece is positioned therein. This and various other modifications or alterations of the foregoing disclosure will occur to those skilled in the art without departure from the fair meaning or proper scope of the following claims.

What is claimed is:

1. A method of creating a resist pattern by chemically developing a resist layer which has been subjected to a patternmaking operation such as selective exposure or drawing, which method comprises:

providing a workpiece having a resist layer formed on an electroconductive surface;

dipping the workpiece in a developing liquid within a developing vessel, the developing liquid having a first predetermined temperature;

establishing an electric current between the electroconductive surface of the workpiece and an electrode immersed in the developing liquid within the vessel;

constantly monitoring, during the progress of development, the magnitude of the electric current flowing between the electroconductive surface of the workpiece and the electrode immersed in the developing liquid within the vessel;

commencing withdrawal of the developing liquid from the developing vessel when the electric current reaches a predefined magnitude during the progress of developing operation; and retarding the progress of further development to assure a sufficient length of time for the complete withdrawal of the liquid from the developing vessel by, substantially concurrently with withdrawal of the developing liquid, introducing an additional amount of developing liquid into the developing vessel, the additional amount of developing liquid having the same composition as the developing liquid that has been received in the developing vessel, but having a second predetermined temperature which is less than the first predetermined temperature.

2. The method of claim 1 wherein at least the developing liquid that has been initially received in the developing vessel at the first predetermined temperature is recovered from the vessel for reuse.

3. The method of claim 1, wherein only the developing liquid that has been initially received in the developing vessel at the first predetermined temperature is recovered from the vessel for reuse.

4. A method of creating a resist pattern by chemically developing a resist layer which as been subjected to a patternmaking operation such as selective exposure or drawing, which method comprises:

providing a workpiece having a resist layer formed on an electroconductive surface;

dipping the workpiece in an initial amount of developing liquid within a developing vessel, the developing liquid having a first predetermined temperature;

establishing an electric current between the electroconductive surface of the workpiece and an electrode;

constantly monitoring, during the progress of development, the magnitude of an electric current flowing between the electroconductive surface of the workpiece and an electrode immersed in the developing liquid within the vessel;

commencing the withdrawal of the developing liquid from the developing vessel when the electric current reaches a peak during the progress of developing operation; and retarding the progress of further development to assure a sufficient length of time for complete withdrawal of the initial developing liquid from the developing vessel by introducing an additional amount of developing liquid into the developing vessel immediately after withdrawal of the developing liquid begins, the additional developing liquid having the same composition as the developing liquid initially present in the developing vessel, but having a temperature lower than the temperature of the initial developing liquid.

5. The method of claim 4, wherein only the developing liquid that has been initially received in the developing vessel at the first predetermined temperature is recovered from the vessel for reuse.

* * * * *